United States Patent [19]

Rother et al.

[11] Patent Number: 4,955,039
[45] Date of Patent: Sep. 4, 1990

[54] QUADRATURE RECEIVER

[75] Inventors: Dietrich Rother, Tamm; Bernd Ripka, Tiefenbronn-Muhlhausen; Rainer Berger, Albstadt, all of Fed. Rep. of Germany

[73] Assignee: Alcatel N.V., Amsterdam, Netherlands

[21] Appl. No.: 346,780

[22] Filed: May 3, 1989

[30] Foreign Application Priority Data

May 4, 1988 [DE] Fed. Rep. of Germany ....... 3815055

[51] Int. Cl.$^5$ .............................................. H03D 1/22
[52] U.S. Cl. ..................................... 375/75; 455/324; 329/358; 329/363
[58] Field of Search ............... 381/2, 15; 455/60, 202, 455/324; 375/39, 75, 77, 97; 370/20; 329/306, 307, 308, 348, 350, 363

[56] References Cited

U.S. PATENT DOCUMENTS

| | | | |
|---|---|---|---|
| 4,397,039 | 8/1983 | McAuliffe | 455/202 |
| 4,476,585 | 10/1984 | Reed | 455/324 |
| 4,736,390 | 4/1988 | Ward et al. | 375/75 |
| 4,852,123 | 7/1989 | Bickley et al. | 375/97 |

FOREIGN PATENT DOCUMENTS

| | | |
|---|---|---|
| 0124949 | 10/1986 | European Pat. Off. . |
| 2435687 | 10/1978 | Fed. Rep. of Germany . |
| 2645950 | 9/1985 | Fed. Rep. of Germany . |
| 3448182 | 9/1988 | Fed. Rep. of Germany . |

OTHER PUBLICATIONS

R. A. Brown et al, Some Features of Signal Demodulation Resulting from the Practical Implementation of a Direct Conversion Radio Receiver, "Phillips Journal of Research," vol. 41, No. 3, 1986, pp. 219-231.

F. E. Churchill et al, The Correction of I and Q Errors in a Coherent Processor-"IEEE Transactions on Aerospace and Electronic Systems", vol. AES-17, No. 1, Jan. 1981; pp. 131-138.

Donald K. Weaver, Jr.-A Third Method of Generation and Detection of Single-Sideband Signals, "Proceedings of the IRE", Dec. 1956, pp. 1703-1705.

*Primary Examiner*—Benedict V. Safourek
*Attorney, Agent, or Firm*—Christie, Parker & Hale

[57] ABSTRACT

A quadrature receiver is disclosed which contains two mixers (M1, M3) in an in-phase receiving path and two mixers (M2, M4) in a quadrature receiving path for converting a received signal to a low IF. Each of the mixers is fed with an oscillator signal (O1 through O4), with the oscillator signal fed to one mixer of the respective receiving path having alternately the same or opposite phase from that of the oscillator signal fed to the other mixer of the same receiving path. In each receiving path, the mixers are followed by a circuit (P', P'') which delivers an in-phase signal and a quadrature signal, respectively. These circuits compensate for the DC offset caused by the mixers.

8 Claims, 4 Drawing Sheets

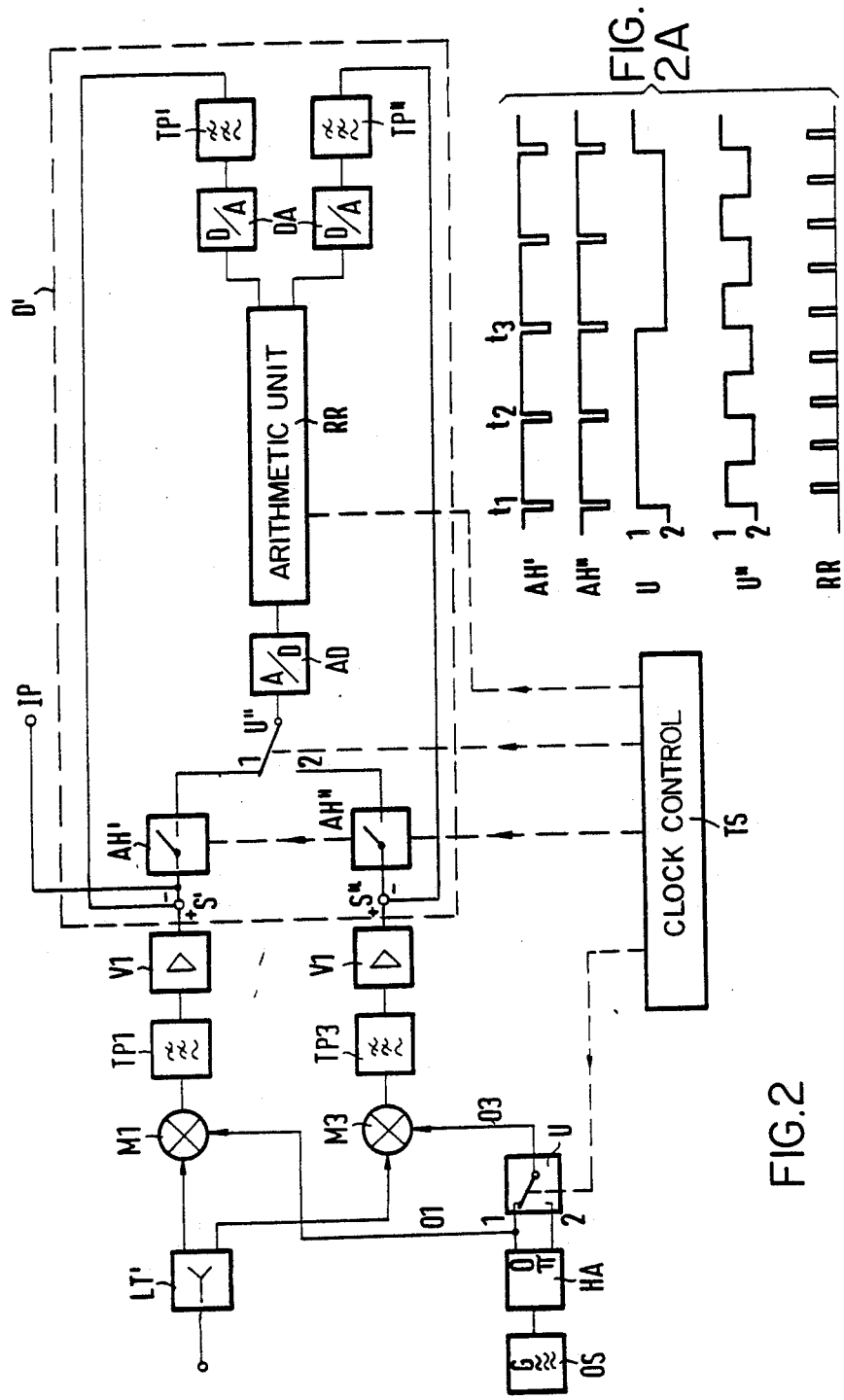

QUADRATURE RECEIVER

TECHNICAL FIELD

The present invention relates to a quadrature receiver.

BACKGROUND ART

A typical quadrature receiver comprising an oscillator for producing a pair of mixing signals which differ in phase by 90° and a pair of mixers for mixing the received signal with the mixing signals to split the received signal into its in-phase and quadrature components is disclosed, for example, in commonly assigned German Patent 26 45 950 (corresponding to GB 1 530 602). When a received signals thus split into its inphase and quadrature components in the known manner, the components may be distorted because of nonideal mixer characteristics.

In "Philips Journal of Research," Vol. 41 No. 3, 1986, pp. 219–231, various methods are described whereby the DC offset appearing at the output of the mixers in zero-IF receivers is compensated for. One of the methods consists of adding an equal, but opposite, DC component to the mixer output. However, this is difficult to implement since the required DC offset varies constantly. In another method, the outputs of the mixers are AC-coupled to the subsequent stages. In that case, however, the carrier necessary for incoherent detection of an amplitude-modulated signal is lost; if the signal is frequency-modulated, signal components in the vicinity of the translating frequency are suppressed.

DISCLOSURE OF INVENTION

It is the object of the invention to provide a quadrature receiver having a circuit which compensates for quadraturesignal distortions caused by nonideal properties, particularly of the mixers.

To that end, a quadrature receiver in accordance with the disclosed invention contains two mixers in an in-phase receiving path and two mixers in a quadrature receiving path. Each of the mixers is fed with an oscillator signal, with the oscillator signal fed to one mixer of the respective receiving path having alternately the same or opposite phase from that of the oscillator signal fed to the other mixer of the same receiving path.

Advantageously, the mixers convert the input signal to a zero IF and a low-pass filter is provided at each mixer output.

BRIEF DESCRIPTION OF DRAWINGS

Exemplary embodiments of the invention are explained in the following detailed description, reference being made to figures of the accompanying Drawing, wherein:

FIG. 2 shows a portion of a second quadrature receiver;

FIG. 2A is a timing diagram associated with the circuitry of FIG. 2;

BEST MODE FOR PRACTICING THE INVENTION

Figure 1:
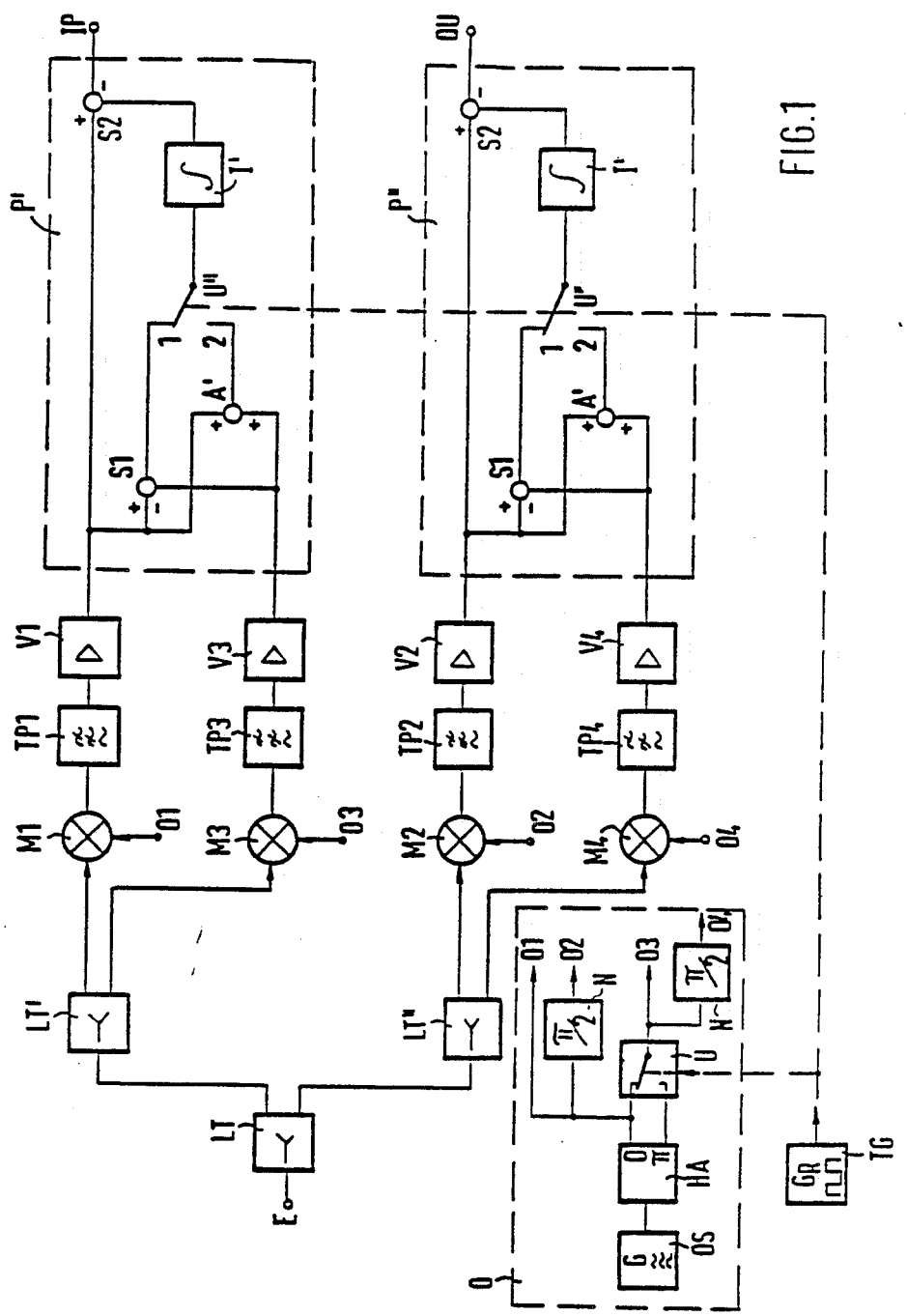
FIG. 1 shows a first quadrature receiver.

The quadrature receiver of FIG. 1 includes three power dividers LT, LT', LT'' which are connected in series in a tree structure and split a received signal E into four partial signals. The power divider LT' is followed by a first mixer M1 and a third mixer M, and the power divider LT'' by a second mixer M2 and a fourth mixer M4. The first mixer M1 is followed by a first low-pass filter TPI, whose output is connected to a first amplifier V1. Similarly, the second, third, and fourth mixers M2, M3, M4 are each followed by a low-pass filter TP2, TP3, TP4 and an amplifier V2, V3, V4. The outputs of the first amplifier V1 and the third amplifier V3 are coupled, respectively, to the first and second inputs of a first circuit P', which provides an in-phase signal IP at its output. The outputs of the second amplifier V2 and the fourth amplifier V4 are connected, respectively, to the first and second inputs of a second circuit P'', whose output provides a quadrature signal QU. The first and second circuits P', P'' are identical in construction. Each circuit P', P'' contains an adder A', two subtracters S1, S2, a changeover switch U'', and an integrator I'. The adder A' adds the two signals fed to the circuit, and the first subtracter S1 subtracts the signal applied at the second input from that at the first input. The changeover switch U'' alternately applies the output signal from the adder A' and the output signal from the first subtracter S1 to the integrator I', whose output is subtracted from the signal at the first input of the circuit P', P'' by the subtracter S2. The output of the second subtracter S2 is the output of the circuit P', P''.

The quadrature receiver further includes an oscillator circuit 0, which generates four oscillator signals 01, 02, 03, 04. The first oscillator signal 01 is fed to the first mixer M1. The second oscillator signal 02 is in phase quadrature with the first and is fed to the second mixer M2.

The third oscillator signal 03 has alternately the same or opposite phase from that of the first and is fed to the third mixer M3. The fourth oscillator signal 04 has alternately the same or opposite phase from that of the second and is fed to the fourth mixer M4.

The oscillator circuit 0 contains an oscillator OS, which is followed by a circuit HA, which divides the signal from the oscillator OS into two signals separated in phase by 180°. The first oscillator signal 01 can be taken directly from one output of the circuit HA, and the second oscillator signal 02 is obtained by passing the first oscillator signal 01 through a 90° phase shifter N. The oscillator circuit 0 further includes a changeover switch U, which delivers the third oscillator signal 03 by alternately connecting the two outputs of the circuit HA to its output. The fourth oscillator signal 04 is produced by passing the third oscillator signal 03 through an additional 90° phase shifter N. The quadrature receiver further includes a clock generator TG, which controls the changeover switch U in the oscillator circuit 0 and the changeover switches U'' in the circuits P', P'' in such a manner that they operate in synchronism. The switching preferably takes place at a frequency of a few kHz.

The compensation, by means of the circuits P', P'', of the DC offset appearing at the outputs of the mixers M1 through M4 and of the additional DC offset caused by the amplifiers V1 through V4 following the mixers M1 through M4 is made possible by the fact that the DC offset is independent of the phase of the oscillator signals 01 through 04, while the converted received signal is dependent on this phase. This results in a sign reversal of the portion of the mixer product stemming from the received signal if the phase of the oscillator signals 03, 04 is switched between 0° and 180°. If the part of the DC offset in the (amplified) product of the first (or second) mixer M1 (or M2) is denoted by G', and the part of the DC offset in the (amplified) product of the third (or fourth) mixer M3 (or M4) by G'', and if the switches U, U'' are in the positions shown in FIG. 1, the output of the first subtraoter S1 provides the quantity G'—G'', which is fed to the integrator I'. After switchover, the output of the adder A provides the quantity G'+G'', which is fed to the integrator I'. Averaged over one switching cycle, the output of +h=integrator I' is thus exactly the quantity G', which is subtracted by means of the second subtracter S2 from the signal stemming from the first (or second) mixer M1 (or M2), which is thus freed from its DC offset G'.

FIG. 2 shows a portion of a second quadrature receiver which differs from that of FIG. 1 in that it contains digital circuits D', D'' with controllers instead of the circuits P', P'' and a clock control TS instead of the clock generator TG. The remaining portion of the second quadrature receiver, containing the second digital circuit D'', which is identical in construction with the first digital circuit D', is not shown for the sake of clarity.

At each of its inputs, the digital circuit D' has a subtracter S', S'' which is followed by a sample and hold circuit AH', AH''. The changeover switch U'' alternately applies the outputs of the two sample and hold circuits AH', AH'' to an A/D converter AD followed by an arithmetic unit RR, whose outputs are coupled to two D/A converters DA. Each D/A converter DA is followed by a low-pass filter TP', TP'', whose output is fed to the inverting input of the associated subtracter S', S''. From the output of the subtracter S', which follows the first input of the digital circuit D', the output signal of the circuit D' can be taken.

As is apparent from the foregoing description, and as shown in FIG. 2, the digital circuit D' contains two feedback control loops. The controlled variables are the DC offsets G' and G'', which are computed by the arithmetic unit RR and maintained at zero by two controllers contained in the arithmetic unit RR. The outputs of the controllers are connected to the D/A converters DA. The command variables necessary for the control processes are generated in the arithmetic unit RR. The controllers are P+I controllers, because of the slow variation of the controlled variables with time, D control is not necessary.

The clock control TS controls not only the changeover switch U in the oscillator circuit and the changeover switch U'' in the digital circuits D', D'', but also the sample and hold circuits AH', AH'' and the arithmetic unit RR. A corresponding timing diagram is shown in FIG. 2A.

The sample and hold circuits AH', AH'' sample the input voltages at the instants t1, t2, ... and store the sample values until the next sampling instant. By continuously reversing the switch U'', these sample values are fed to the arithmetic unit RR after undergoing analog-to-digital conversion. The timing diagram shows the case in which after each changeover, two sample values are read into the arithmetic unit RR and averaged there.

Figure 2B:
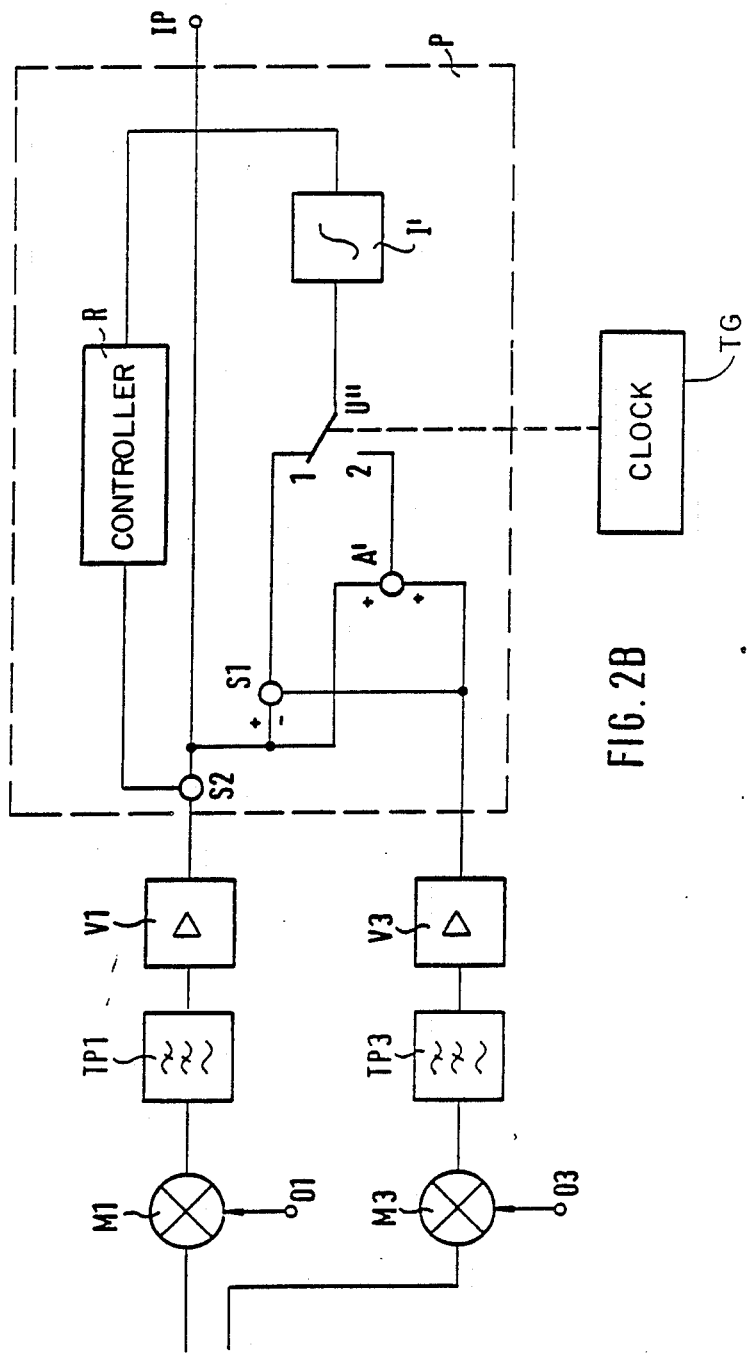
FIG. 2B shows a portion of the first receiver modified to incorporate certain features of the second receiver.

Unlike the circuits P', P'' of the first embodiment of FIG. 1, which do not include a controller, the digital circuits D', D'' also compensate for linearity errors of the circuits and deviations from unit gain with the aid of the controllers. If the DC offsets G', G'' of both mixers are compensated for, the transient times of the feedback control loop are shorter than if there is only one feedback control loop to compensate for the DC offset G'. The modified version Pmoi of the circuits P', P'' shown in FIG. 2B is provided with such a feedback control loop: the integrator I' is followed by a controller R, and the circuit output (from subtracter S2) is fed to the adder A' and subtracter Sl.

Figure 3:
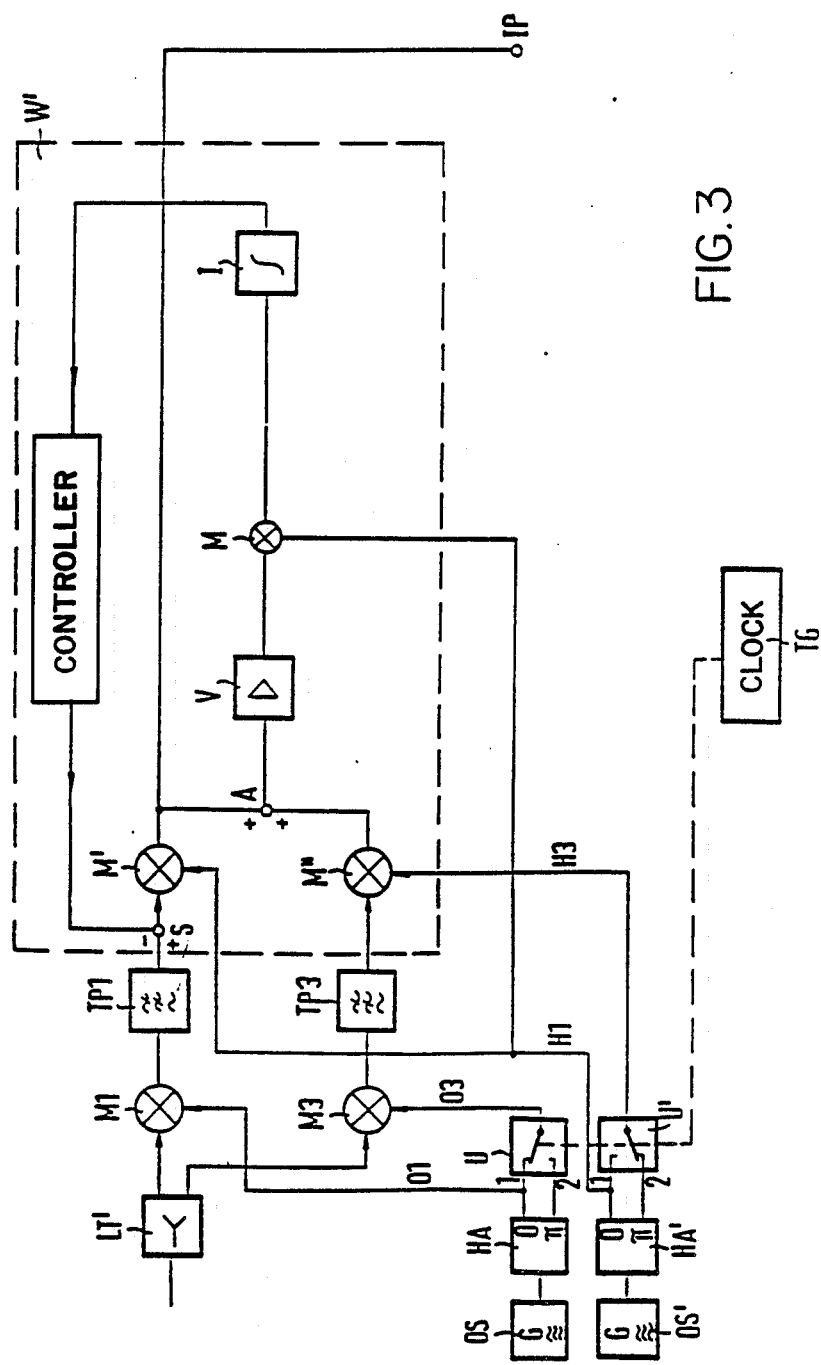
FIG. 3 shows a portion of a third quadrature receiver using Weaver's "third method."

FIG. 3 shows a portion of a third quadrature receiver which uses Weaver's "third method" and differs from that of FIG. 1 by the circuits W', W''. Like in FIG. 2, the remaining portion, including the circuit W''', which is identical in construction with the circuit W', is not shown for the sake of clarity. The third quadrature receiver includes an additional oscillator circuit which is identical in construction to the oscillator circuit 0. This additional oscillator circuit, of which only a portion is shown, generates the four auxiliary signals H1 through H4.

The clock generator TG controls the changeover switches U, U' in the oscillator circuits in such a way that these switches are operated simultaneously, but in phase opposition.

The circuit W' has a subtracter S at its first input and a further mixer M'' at its second input. The subtracter S is followed by another mixer M', whose output is the output signal of the circuit W'. The outputs of the mixers M', M'' are fed to an adder A followed by an amplifier V which is followed by an additional mixer M. The additional mixer M and the other mixer M'' are fed with the first auxiliary signal Hl, and the further mixer M'' with the third auxiliary signal H3, which has alternately the same or opposite phase from that of the first. The additional mixer M is followed by an integrator I having its output connected to a controller R. The output of the latter is fed to the inverting input of the subtracter S.

What is claimed is:

1. A quadrature receiver comprising:
    oscillator means for producing:
        a first oscillator signal,
        a second oscillator signal which differs in phase by 90 from the first oscillator signal,
        a third oscillator signal alternately in phase with and in phase opposition to the first oscillator signal, and
        a fourth oscillator signal alternately in phase with and in phase opposition to the second oscillator signal;
    a first mixer for mixing a received signal with the first oscillator signal;
    a second mixer for mixing the received signal with the second oscillator signal;
    a third mixer for mixing the received signal with the third oscillator signal;
    a fourth mixer for mixing the received signal with the fourth oscillator signal;
    first circuit means having a first input coupled to an output from the first mixer and a second input coupled to an output of the third mixer for providing an in-phase signal; and
    second circuit means having a first input coupled to an output of the second mixer and a second input coupled to an output of the fourth mixer for providing a quadrature signal.

2. A receiver as claimed in claim 1, wherein the first and second circuit means are substantially identical in construction and are each respectively coupled to its two associated said mixer outputs by means of a respective low-pass filter.

3. A receiver as claimed in claim 2 wherein the first, second, third and fourth mixers convert the input signal to a zero IF.

4. A receiver as claimed in claim 2 wherein each of said first and second circuit means further comprises:
   an adder for adding the signals applied to the first and second inputs of said each circuit means to thereby produce an adder output signal,
   a first subtracter for subtracting the signal applied to said second input from the signal applied to said first input to thereby produce a first subtracter output signal,
   an integrator for integrating a signal applied to an integrator input to thereby produce an integrator output signal,
   changeover means synchronized to the phase reversals of the third and fourth oscillator signals, for applying either an output of the adder or an output of the first subtracter to the integrator input, and
   a second subtracter for subtracting the integrator output signal from the signal applied to the first input to thereby provide a circuit means output signal.

5. A receiver as claimed in claim 2, wherein each of said first and second circuit means further comprises:
   a first subtracter for subtracting a feedback signal from the signal applied to the first input to thereby provide a circuit means output signal,
   an adder for adding the circuit means output signal to the signal applied to the second input of said each circuit means to thereby produce an adder output signal,
   a second subtracter for subtracting the signal applied to said second input from said circuit means output signal to thereby produce a second subtracter output signal,
   an integrator for integrating a signal applied to an integrator input to thereby produce an integrator output signal,
   changeover means synchronized to the phase reversals of the third and fourth oscillator signals, for applying either the adder output signal or the second subtracter output signal to the integrator input, and
   controller means responsive to the integrator output signal for providing said feedback signal.

6. A receiver as claimed in claim 3, wherein each of said first and second circuit means further comprises:
   a first subtracter for subtracting a first feedback signal from the signal applied to the first input of said each circuit means to thereby produce a circuit means output signal,
   a second subtracter for subtracting a second feedback signal from the signal applied to the second input of said each circuit means to thereby produce a second subtracter output signal,
   compensation means including an arithmetic unit for computing said first and second feedback signals from a digital signal derived from said circuit means output signal and said second subtracter output signal,
   wherein said first and second feedback signals compensate for the DC offset in the signals output by the mixers.

7. A receiver as claimed in claim 6, further comprising
   at least one A/D converter for coupling analog signals output by the first and second subtracters to an input of the arithmetic unit, and
   two D/A converters for respectively coupling digital signals output by the arithmetic unit to the first and second subtracters.

8. A receiver as claimed in claim 2, wherein
   the received signal is converted by the first, second, third and fourth oscillator signals to a low IF different from zero,
   each of said first and second circuits means further comprises:
      auxiliary oscillator means for producing:
         a first auxiliary signal, and
         a second auxiliary signal being alternately in phase with and in phase opposition to the first auxiliary signal,
   a subtracter for subtracting a feedback signal from the signal applied to the first input of said each circuit means to thereby produce a subtracter output signal,
   a fifth mixer for mixing said subtracter output signal with said first auxiliary signal to thereby produce a first high IF signal
   a sixth mixer for mixing the second input of said each circuit means with said second auxiliary signal to thereby produce a second high IF signal
   an adder for adding the first and second high IF signals to thereby produce an adder output signal
   a seventh mixer for mixing the adder output signal with the first auxiliary signal to thereby convert the adder output signal to a low IF signal
   an integrator for integrating the low IF signal to thereby produce an integrator output signal, and
   a controller for deriving said feedback signal from said integrator output signal, and
   the phases of the first and second auxiliary signals in each of said first and second circuit means is shifted by 90 with respect to each other.

* * * * *

UNITED STATES PATENT AND TRADEMARK OFFICE
CERTIFICATE OF CORRECTION

PATENT NO. : 4,955,039

DATED : September 4, 1990

INVENTOR(S) : Dietrich Rother; Bernd Ripka; Rainer Berger

It is certified that error appears in the above-identified patent and that said Letters Patent is hereby corrected as shown below:

```
Column 1, line 16, change "signals thus" to
          -- signal is thus --.
Column 1, line 16, change "inphase" to -- in-phase --.
Column 1, line 38, change "quadraturesignal" to
          -- quadrature-signal --.

Column 2, line 12, change "Vl" to -- V1 --.
Column 2, line 26, change "Sl" to -- S1 --.
Column 2, line 37, change "Ml" to -- M1 --.

Column 3, line 8,  change "Ml" to -- M1 --.
Column 3, line 12, change "subtraoter" to -- subtracter --.
Column 3, line 15, after "output of" delete "+h=" and insert
          -- the --.
Column 3, line 62, change "t1, t2" to -- $t_1$ $t_2$ --.

Column 4, line 9,  change "$P_{moi}$" to -- $P_{mod}$ --.
Column 4, line 12, after "subtracter" change "Sl" to
          -- S1 --.
Column 4, line 37, change "Hl" to -- H1 --.
```

UNITED STATES PATENT AND TRADEMARK OFFICE
CERTIFICATE OF CORRECTION

PATENT NO. : 4,955,039

DATED : September 4, 1990

INVENTOR(S) : Dietrich Rother; Bernd Ripka; Rainer Berger

It is certified that error appears in the above-identified patent and that said Letters Patent is hereby corrected as shown below:

Column 4, line 48, change "90" to -- 90° --.

Column 6, line 56, change "90" to -- 90° --.

Signed and Sealed this

Fifth Day of May, 1992

*Attest:*

DOUGLAS B. COMER

*Attesting Officer*     *Acting Commissioner of Patents and Trademarks*